United States Patent [19]
Guthrie

[11] 3,966,515
[45] June 29, 1976

[54] METHOD FOR MANUFACTURING HIGH VOLTAGE FIELD-EFFECT TRANSISTORS

[75] Inventor: Samuel Josepheus Guthrie, Portland, Oreg.

[73] Assignee: Teledyne, Inc., Los Angeles, Calif.

[22] Filed: May 17, 1974

[21] Appl. No.: 470,803

[52] U.S. Cl. .............................. 148/188; 148/187
[51] Int. Cl.² ...................................... H01L 7/34
[58] Field of Search ................. 148/187, 175, 188

[56] References Cited
UNITED STATES PATENTS

| | | | |
|---|---|---|---|
| 3,560,278 | 2/1971 | Sanera | 148/187 |
| 3,676,231 | 7/1972 | Medvecky et al. | 148/188 |
| 3,775,197 | 11/1973 | Sahagun | 148/188 |

*Primary Examiner*—G. Ozaki
*Attorney, Agent, or Firm*—Ronald W. Reagin

[57] ABSTRACT

A method of manufacturing field-effect transistors is disclosed which includes the steps of growing an epitaxial layer on a substrate wafer, forming channels of the desired conductivity on the wafer, forming the gate electrodes on the wafer and then forming source and drain electrodes on the wafer. The gate electrodes are formed by first masking the gate electrode area and performing a first boron deposition and boron diffusion step. A second boron deposition and diffusion step is then provided to enable the resultant field-effect transistor to operate at higher voltages.

1 Claim, 1 Drawing Figure

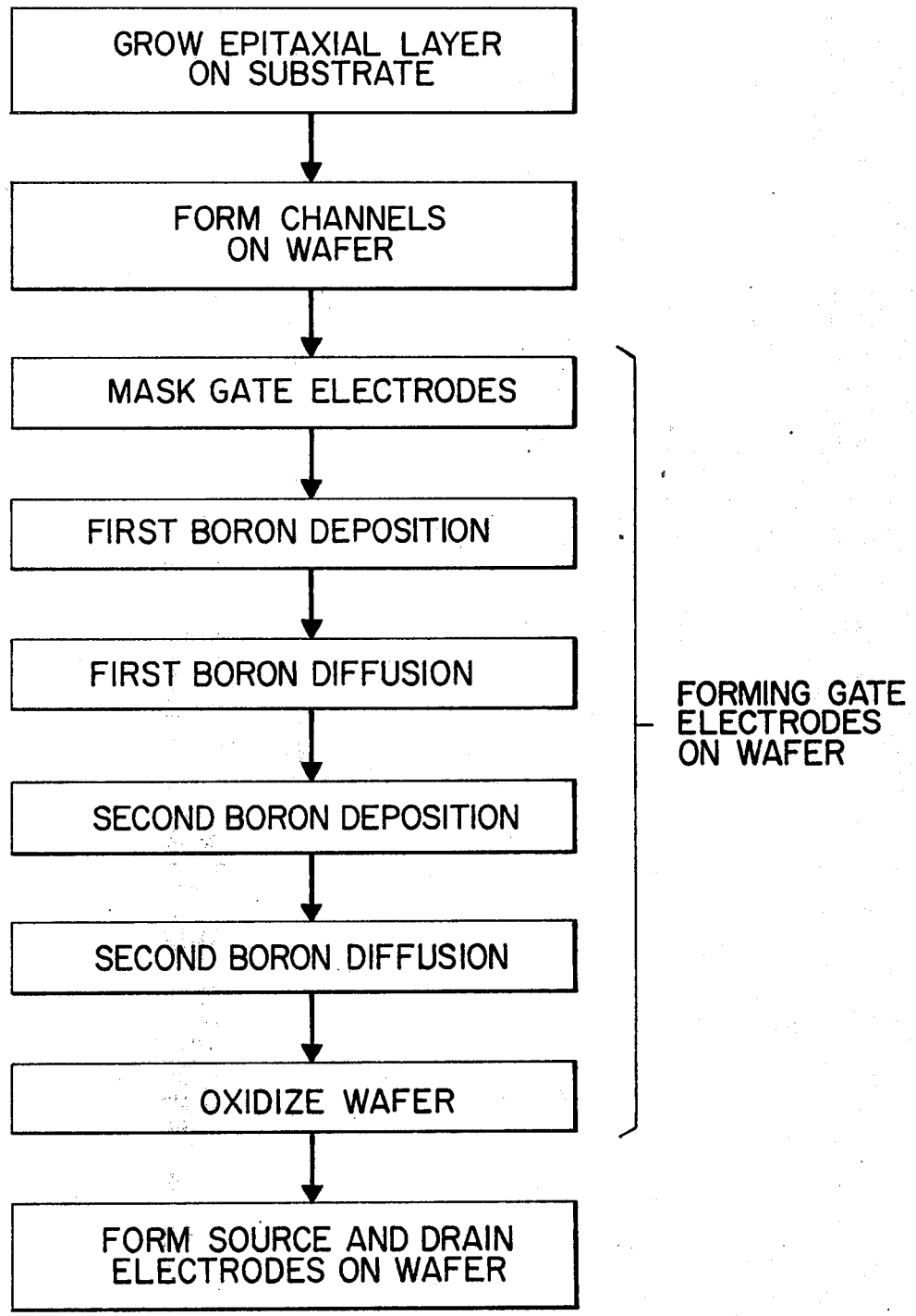

METHOD FOR MANUFACTURING HIGH VOLTAGE FIELD-EFFECT TRANSISTORS

The present invention relates to methods of manufacturing semiconductor devices, and more particularly to a method for manufacturing field-effect transistors which can operate in high voltage circuits.

It is well known that most semiconductor devices are capable of operating at relative low voltage. Indeed, this has been one of their primary advantages and one of the reasons why, for many applications, semiconductor devices have almost completely replaced vacuum tubes and other such prior art devices.

However, this characteristic is, at times, a disadvantage and has kept semiconductor devices from replacing vacuum tubes in certain applications. For example, telephone communication equipment is usually designed to last for many years, typically thirty years or more, and equipment which was designed and installed several years ago usually incorporated vacuum tubes, since suitable semiconductor devices were not available at that time. This equipment, of necessity, used the relatively high voltage power supplies which are necessary for proper operation of vacuum tubes. Now, with the further development of semiconductor devices, especially field-effect transistors, it would be very desirable if the semiconductor devices could replace the vacuum tubes in such equipment on a one-for-one basis. However, since the equipment is already operating at relatively high voltages, it would be necessary for these semiconductor devices to be able to operate in this high voltage environment.

By high voltages, in this context, it is meant voltages in the order of 300 volts. Thus, if a vacuum tube in such equipment has a plate-to-grid voltage of 300 volts, the field-effect transistors replacing this tube would have to be able to operate with a drain-to-gate electrode voltage of 300 volts.

Such operating voltages have represented the extreme upper limit in the capability of field effect transistors manufactured in accordance with various prior art methods of manufacture. It has been problematical whether or not a particular transistor would operate at these voltages, and the only way to obtain a suitable number of transistors has been to manufacture considerably more transistors than are required, and then test each one to select from the group those which can withstand these operating voltages. The yield factor has been relatively low, and it has been necessary to manufacture great many more transistors than are actually required for a given application.

It is accordingly an object of the present invention to provide an improved method of manufacturing semiconductor devices.

It is another object of the present invention to provide an improved method of manufacturing field-effect transistors.

It is another object of the present invention to provide an improved method of manufacturing field-effect transistors which can operate at relatively high voltages and which has a much higher yield factor than does the prior art methods.

Briefly stated, and in accordance with the presently preferred embodiment of the invention, a method of manufacturing field-effect transistors is provided which includes the steps of growing an epitaxial layer on a substrate wafer, forming channels of the desired conductivity on the wafer, forming the gate electrodes on the wafer and then forming source and drain electrodes on the wafer. The gate electrodes are formed by first masking the gate electrode area and performing a first boron deposition and boron diffusion step, in accordance with the prior art. However, in accordance with one of the features of the present invention, a second boron deposition and diffusion step is then provided to enable the resultant field-effect transistor to operate at higher voltages.

For a complete understanding of the invention and an appreciation of its other objects and advantages, please refer to the following detailed description of the attached drawing, in which the sole FIGURE is a flow diagram of the method of the present invention.

Referring now to the drawing, the manufacture of the field-effect transistor begins by growing an epitaxial layer of the desired conductivity upon a substrate wafer to the opposite conductivity. For example, in a typical device an N conductivity layer may be grown on a P conductivity substrate. The manner of forming the epitaxial layer on the substrate is conventional, and may be done by any of the manners known to those skilled in the art. The substrate wafer is formed from any suitable material, typically silicon.

Next, again as in the prior art, the isolation step of forming the channels on the wafer is performed. For example, N conductivity channels may be formed on the wafer by conventional isolation masking, boron deposition, boron diffusion and oxidation steps.

The next step in the method is to form the gate electrodes on the wafer. Typically, this is effected by first masking the gate electrode areas and performing boron deposition and boron diffusion steps on the wafer as so masked. As is well known to those skilled in the art, by controlling the time and temperature of these steps, the punch-through voltage of the device is set. Next, and in accordance with the primary feature of the present invention, a second boron deposition and diffusion operation is performed on the wafer. It is not completely certain why performing this second boron deposition and diffusion step causes the field-effect transistor to be able to withstand higher voltages, but it is believed that this desired result is achieved because the second boron deposition and diffusion steps minimize the surface depletion curvature effect within the device, thereby reducing the likelihood of failure of the device under relatively high voltages.

The second boron deposition and diffusion steps may by performed in any of the manners known to those skilled in the art, but in the preferred embodiment of the invention, the second boron deposition step is effected by placing the wafer into an oven whose temperature is substantially 1100°C. The wafer remains in the oven for a first, warm-up time period of substantially five minutes, during which time the wafer becomes heated to the oven temperature. Boron is then introduced into the oven, such as in the form of $BBr_3$, and the wafer remains in the oven for a second, source cycle time period of substantially 5 minutes. The wafer then remains in the oven for a third, drive-in time period of substantially 15 minutes, during which time period the boron which was deposited on the surface of the wafer is driven into the silicon surface for a depth of several thousand angstrom units. Oxygen is then introduced into the oven for a fourth, high-oxygen time period of substantially 3 minutes.

The wafer is then removed from the oven and cleaned in a suitable manner, such as by being dipped into a hydrofluoric acid solution. The second boron diffusion step is then effected, preferably by placing the wafer in another heated oven, whose temperature is substantially 1100°C for a time period of substantially thirty minutes.

After the second boron diffusion step, the wafer is then oxidized, which is, again, a conventional step in the manufacture of field-effect transistors. For example, this oxidation may be effected by placing the wafer in an oven whose temperature is 1000°C, subjecting it to 5 minutes of dry oxygen, then 6 hours of steam, followed by 30 minutes of dry oxygen.

After the gate electrodes are so formed on the wafer, in accordance with the present invention just described, the source and drain electrodes are formed on the wafer, by any of the conventional manners, the wafer is scribed and broken into desired units, which then may be mounted and tested, all in the conventional manner.

By utilizing the features of the present invention, described above, it has been found that a much higher percentage yield of field-effect transistors is achieved which can operate at relatively high voltages, such as at 300 voltages between the drain and gate electrodes.

While the invention is thus disclosed and the preferred embodiment described in detail, the invention is obviously not limited to this described embodiment. Instead, many modifications will occur to those skilled in the art which lie within the spirit and scope of the invention. It is thus intended that the invention be limited in scope only by the appended claims.

What is claimed is:

1. The method of manufacturing high voltage field-effect transistors, comprising the steps of:

growing an epitaxial layer of a desired conductivity upon a substrate of the opposite conductivity, forming channels of desired conductivity on the wafer, forming gate regions on the wafer by the steps of:
  masking the wafer to expose only the gate region areas,
  forming a first boron deposition on the wafer,
  diffusing the first boron deposition into the wafer,
  forming a second boron deposition on the wafer,
  diffusing the second boron deposition into the wafer, and
  oxidizing the wafer, and forming the source and drain electrodes on the wafer.

* * * * *